(12) United States Patent
Shim

(10) Patent No.: US 10,563,797 B2
(45) Date of Patent: Feb. 18, 2020

(54) STRUCTURE FOR PREVENTING LEAK AT SYNTHETIC RESIN TUBE JOINT

(71) Applicant: Euhan Flowtech Inc., Gyeonggi-do (KR)

(72) Inventor: Se Yoo Shim, Gyeonggi-do (KR)

(73) Assignee: Euhan Flowtech Inc., Gyeonggi-do (KR)

( * ) Notice: Subject to any disclaimer, the term of this patent is extended or adjusted under 35 U.S.C. 154(b) by 444 days.

(21) Appl. No.: 15/286,568

(22) Filed: Oct. 6, 2016

(65) Prior Publication Data
US 2017/0328499 A1 Nov. 16, 2017

(30) Foreign Application Priority Data
May 16, 2016 (KR) .................. 10-2016-0059563

(51) Int. Cl.
| | |
|---|---|
| *F16L 19/02* | (2006.01) |
| *F16L 19/00* | (2006.01) |
| *H01L 23/00* | (2006.01) |
| *F16L 47/04* | (2006.01) |

(52) U.S. Cl.
CPC .............. *F16L 19/02* (2013.01); *F16L 19/005* (2013.01); *F16L 47/041* (2019.08); *H01L 24/00* (2013.01)

(58) Field of Classification Search
CPC ... F16L 19/02; F16L 19/0206; F16L 19/0212; F16L 19/0225; F16L 19/025; F16L 19/0283; F16L 19/0286; F16L 19/04; F16L 19/005; F16L 33/223; F16L 33/225; F16L 33/226

USPC .......................... 285/89, 92, 247, 332, 332.2
See application file for complete search history.

(56) References Cited

U.S. PATENT DOCUMENTS

| | | | | |
|---|---|---|---|---|
| RE23,586 | E | * 11/1952 | Merriman | F16L 19/005 |
| | | | | 285/89 |
| 3,294,141 | A | * 12/1966 | Schotthoefer | F16B 39/10 |
| | | | | 384/562 |
| 3,608,933 | A | * 9/1971 | Lee | E21B 17/043 |
| | | | | 285/334 |

(Continued)

FOREIGN PATENT DOCUMENTS

| | | |
|---|---|---|
| EP | 2602529 | 6/2013 |
| JP | 02-117494 | 9/1990 |

(Continued)

OTHER PUBLICATIONS

Grounds of Reasons of Rejection dated Sep. 1, 2017 From the Korean Intellectual Property Office Re. Application No. 2016-0059563. (5 Pages).

(Continued)

*Primary Examiner* — Aaron M Dunwoody

(57) ABSTRACT

Disclosed is a structure for preventing a leak at a synthetic resin tube joint, which includes a synthetic resin tube including a tapered portion at an end portion; a ferrule inserted into the end portion of the synthetic resin tube and including a tapered portion corresponding to the tapered portion of the synthetic resin tube; a fitting which accommodates the synthetic resin tube and the ferrule, and includes a tapered portion corresponding to the tapered portion of the synthetic resin tube and a protrusion formed on the tapered portion of the fitting, and a nut which engages with the fitting.

1 Claim, 9 Drawing Sheets

(56) References Cited

U.S. PATENT DOCUMENTS

| | | | | |
|---|---|---|---|---|
| 4,286,807 | A * | 9/1981 | Bachli | F16L 19/005 285/382.7 |
| 4,940,260 | A * | 7/1990 | Uriarte Odriozola | F16B 39/24 285/3 |
| 5,388,871 | A * | 2/1995 | Saitoh | F16L 19/0218 285/247 |
| 5,498,043 | A * | 3/1996 | Goldenberg | F16L 33/226 285/242 |
| 6,045,164 | A * | 4/2000 | Nishio | F16L 19/041 285/331 |
| 6,142,535 | A * | 11/2000 | Nishio | F16L 19/005 285/331 |
| 6,334,632 | B1 * | 1/2002 | Nishio | F16L 47/04 285/331 |
| 6,688,651 | B2 * | 2/2004 | Min-Cheol | F16L 19/005 285/92 |
| 6,971,683 | B2 * | 12/2005 | Mizukoshi | F16L 19/0283 285/247 |
| 7,938,452 | B2 * | 5/2011 | Katsura | F16L 41/10 285/219 |
| 8,992,148 | B2 * | 3/2015 | Schafer | H01R 13/622 285/92 |
| 9,151,427 | B2 * | 10/2015 | Imanishi | F16L 19/028 |
| 2003/0197382 | A1 * | 10/2003 | Fischer | F16K 27/003 285/423 |
| 2004/0227345 | A1 * | 11/2004 | Okamoto | F16L 19/04 285/331 |
| 2006/0151994 | A1 * | 7/2006 | Marc | F16L 19/005 285/92 |
| 2006/0157975 | A1 * | 7/2006 | Fujii | F16L 19/028 285/247 |
| 2014/0334894 | A1 * | 11/2014 | Marchand | F16B 31/027 411/1 |
| 2016/0061357 | A1 * | 3/2016 | Fujii | F16L 19/028 285/382.5 |
| 2016/0061360 | A1 * | 3/2016 | Fujii | F16L 19/028 285/382.5 |
| 2016/0215912 | A1 * | 7/2016 | Fujii | F16L 47/04 |
| 2019/0024836 | A1 * | 1/2019 | Fujii | F16L 19/041 |

FOREIGN PATENT DOCUMENTS

| | | |
|---|---|---|
| JP | 2000-234692 | 8/2000 |
| JP | 2003-254475 | 9/2003 |
| JP | 2004-176760 | 6/2004 |
| JP | 2009-063090 | 3/2009 |
| JP | 2016-070388 | 5/2016 |
| WO | WO 2015/033997 | 3/2015 |

OTHER PUBLICATIONS

Notice of Reason for Rejection dated Nov. 28, 2017 From the Japan Patent Office Re. Application No. 2016-197024. (5 Pages).

* cited by examiner

STRUCTURE FOR PREVENTING LEAK AT SYNTHETIC RESIN TUBE JOINT

RELATED APPLICATION

This application claims the benefit of priority of Korean Patent Application No. 10-2016-0059563 filed May 16, 2016, the contents of which are incorporated herein by reference in their entirety.

FIELD AND BACKGROUND OF THE INVENTION

The present invention relates to a structure for preventing a leak at a synthetic resin tube joint.

Various types of liquid chemicals and water are frequently used in a process of manufacturing semiconductor devices, displays, etc. The various types of liquid chemicals include, for example, an acidic solution, such as hydrofluoric acid, sulfuric acid, hydrochloric acid, nitric acid, phosphoric acid, etc., an alkaline solution which contains potassium hydroxide, sodium hydroxide, ammonium, etc., chemicals used in cleaning solutions, etc. Of the liquid chemicals, ozonized dilute hydrofluoric acid is used in a process of cleaning and etching semiconductor substrates, etc.

Such liquid chemicals are transferred through a transfer system including a tube or pipe for which a synthetic resin tube made of a fluoro-based resin is generally used. Since the chemicals flowing through a synthetic resin tube employed in transfer systems of semiconductor manufacturing facilities are high-purity and deadly poisonous chemicals, a leak of the chemicals may be fatal not only to a production yield rate of semiconductor products but also to humans. Accordingly, stricter and tighter sealability is required for a plurality of synthetic resin tubes that form a transfer system and unions, nuts, connectors, valves, and the like for connecting, opening and closing the synthetic resin tubes.

SUMMARY OF THE INVENTION

The present invention is directed to providing a structure with excellent sealability for preventing a leak at a synthetic resin tube joint.

One aspect of the present invention provides a structure for preventing a leak at a synthetic resin tube joint, which includes a synthetic resin tube having a tapered portion at an end portion, a ferrule inserted into the end portion of the synthetic resin tube and having a tapered portion corresponding to the tapered portion of the synthetic resin tube, a fitting which accommodates the synthetic resin tube and the ferrule and has a tapered portion corresponding to the tapered portion of the synthetic resin tube and a protrusion formed on the tapered portion of the fitting, and a nut which engages with the fitting.

The structure of a synthetic resin tube joint according to one embodiment of the present invention may satisfy Expressions 3, 4, and/or 5 below:

$$0.3 \leq L3/L2 \leq 0.7 \quad \text{[Expression 3]}$$

In Expression 3, L2 represents an entire length of the ferrule and L3 represents a length of a sloped surface of the tapered portion of the ferrule.

$$2 \leq A2 \leq 6 \quad \text{[Expression 4]}$$

In Expression 4, A2 represents an angle formed by a sloped surface of the tapered portion of the ferrule and a surface parallel with a central axis of the ferrule.

$$0.1 \leq T3/T2 \leq 0.5 \quad \text{[Expression 5]}$$

In Expression 5, T2 represents a thickness of the synthetic resin tube and T3 represents a thickness of the protrusion of the fitting.

Another embodiment of the present invention provides a structure of a synthetic resin tube joint, which additionally includes a rounded portion formed at an end portion of the ferrule and formed as a circular arc surface, and a rounded portion formed inside the fitting and corresponding to the rounded portion of the ferrule.

The structure of a synthetic resin tube joint may satisfy Expressions 1 and/or 2 below:

$$0.8 \leq T1/L1 \leq 1.2 \quad \text{[Expression 1]}$$

In Expression 1, T1 represents a maximum thickness of the rounded portion of the ferrule in a vertical direction and L1 represents a maximum length of the rounded portion of the ferrule in a horizontal direction.

$$30 \leq A1 \leq 60 \quad \text{[Expression 2]}$$

In Expression 2, A1 represents an angle formed by a tangent line at the center of the circular arc surface of the rounded portion of the ferrule and a central axis of the ferrule.

Still another embodiment of the present invention provides a structure of a synthetic resin tube joint, which additionally includes a flange portion formed to protrude from an outer circumferential surface of the fitting, a sawtooth portion formed on a side surface of the flange portion, and a ring which engages with a nut and including a sawtooth portion which engages with the sawtooth portion of the fitting at a side surface of the ring.

The sawtooth portion of the ring according to the still another embodiment of the present invention may include a first sloped portion formed in a plate shape and configured to form a slope with respect to the side surface of the ring, a second sloped portion connected to the first sloped portion, and a hook portion which connects the second sloped portion and the side surface of the ring.

The structure of a synthetic resin tube joint according to the still another embodiment of the present invention may satisfy Expressions 6, 7 and/or 8 below:

$$0.2 \leq L5/L4 \leq 0.6 \quad \text{[Expression 6]}$$

In Expression 6, L4 represents an entire length of the sawtooth portion of the ring and L5 represents a length of the second sloped portion.

$$0.5 \leq W2/W1 \leq 0.9 \quad \text{[Expression 7]}$$

In Expression 7, W1 represents a width of the first sloped portion and W2 represents a width of the second sloped portion.

$$10 \leq A3 \leq 25 \quad \text{[Expression 8]}$$

In Expression 8, A3 represents an angle formed by the first sloped portion and the side surface of the ring.

According to the embodiments of the present invention, a leak at a synthetic resin tube joint can be effectively prevented since sealability is enhanced by rounded portions of a ferrule and a fitting and/or a protrusion of the fitting, and nut loosening of the synthetic resin tube joint can be effectively prevented by sawtooth portions of the fitting and a ring.

DESCRIPTION OF SPECIFIC EMBODIMENTS OF THE INVENTION

Hereinafter, the present invention will be described in detail.

First Embodiment

Figure 1:
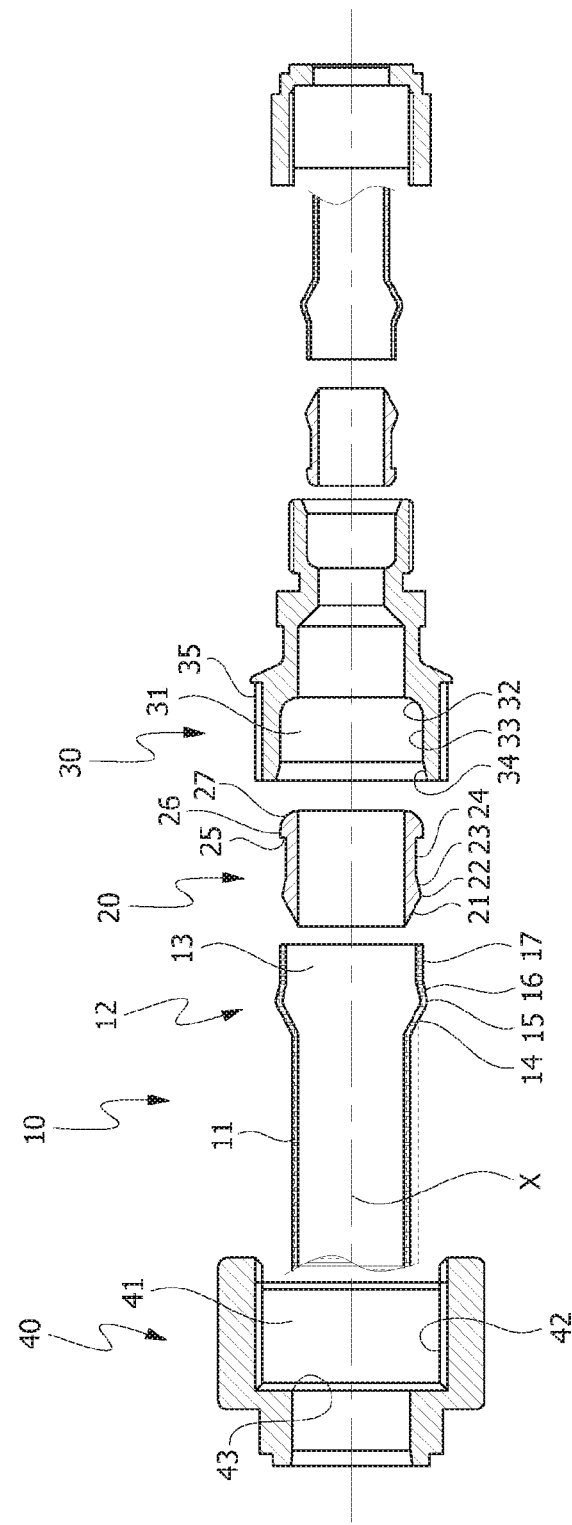
FIG. 1 is an exploded view illustrating a structure of a synthetic resin tube joint according to a first embodiment of the present invention.
Figure 2:
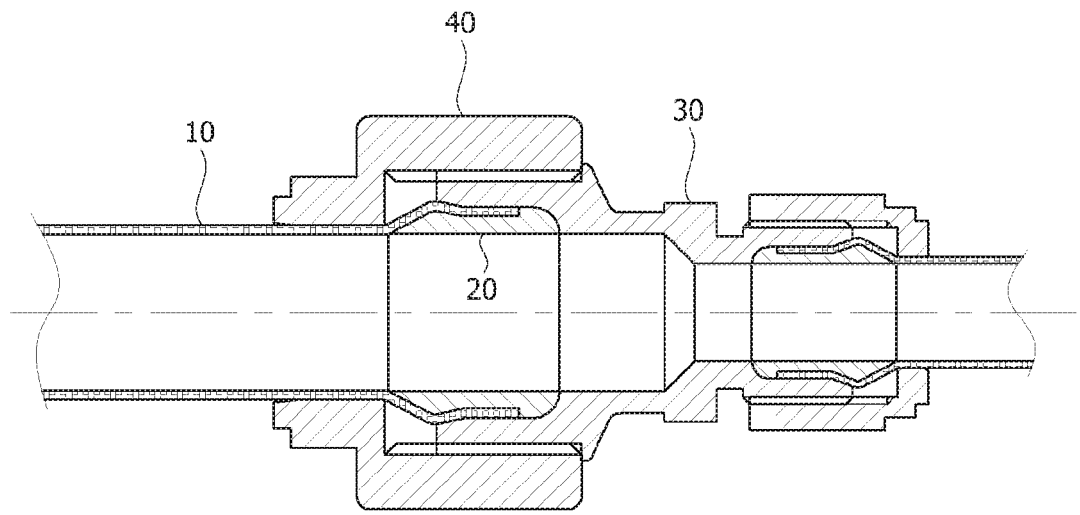
FIG. 2 is an assembly view of FIG. 1.
Figure 3:
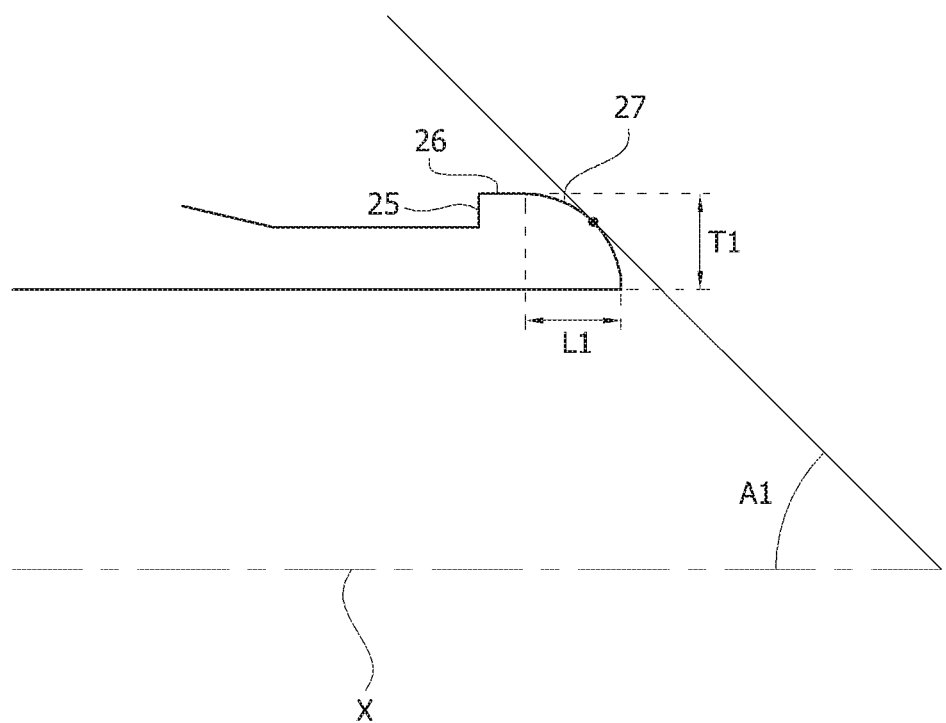
FIG. 3 is an enlarged view of a part of a ferrule illustrated in FIG. 1.

FIG. 1 is an exploded view illustrating a structure of a synthetic resin tube joint according to a first embodiment of the present invention, FIG. 2 is an assembly view of FIG. 1, FIG. 3 is an enlarged view of a part of a ferrule illustrated in FIG. 1, and a joint structure of the first embodiment relates to a leak prevention structure of the synthetic resin tube joint by rounded portions 27 and 32 of a ferrule 20 and a fitting 30. The joint structure of the first embodiment may include a synthetic resin tube 10, the ferrule 20, the fitting 30, a nut 40, etc.

The synthetic resin tube 10 may include a main body portion 11 which occupies most of the length of the tube 10 and an expanded tube portion 12 formed at an end portion of the tube 10. The expanded tube portion 12 is a region with a diameter that is intentionally expanded. Since the synthetic resin tube 10 is made of a synthetic resin, the diameter may easily expand when heated. The expanded tube portion 12 has a diameter greater than a diameter of the main body portion 11 over the entire length of the expanded tube portion 12. A thickness of the expanded tube portion 12 may be uniform over the entire length of the expanded tube portion 12 and may also be the same as a thickness of the main body portion 11. The ferrule 20 described below is inserted into the inside 13 of the expanded tube portion 12, and an inner diameter of the expanded tube portion 12 may vary corresponding to an outer diameter thereof.

The expanded tube portion 12 may sequentially include a first tapered portion 14, a maximum diameter portion 15, a second tapered portion 16, and a uniform diameter portion 17 from the nearest side to the main body portion 11. The first tapered portion 14 is a region with a diameter gradually increasing toward an end of the synthetic resin tube 10 up to the maximum diameter portion 15 and may be formed as a plane and/or a curved surface. The maximum diameter portion 15 is a region in which a diameter is the largest in the expanded tube portion 12 and may be formed as an edge shape as illustrated in the drawings, but it also be formed as a plane and/or a curved surface. The second tapered portion 16 is a region with the diameter gradually decreasing toward the end of the synthetic resin tube 10, from the maximum diameter portion 15 up to the uniform diameter portion 17, and may be formed as a plane and/or a curved surface. The uniform diameter portion 17 is a region which is uniform in diameter to the end of the synthetic resin tube 10 and has a diameter greater than the diameter of the main body portion 11 and smaller than the diameter of the maximum diameter portion 15. Lengths and sloped angles of the tapered portions 14 and 16, and a length of the uniform diameter portion 17, etc. are not particularly limited and may be suitably modified as needed.

The reason for forming the plurality of the tapered portions 14 and 16 based on the maximum diameter portion 15 is for enhancing sealability when the ferrule 20, the fitting 30, and the nut 40 are engaged and for effectively preventing the synthetic resin tube 10 from being separated even when high pressure is applied in the synthetic resin tube 10. That is, a phenomenon in which the synthetic resin tube 10 is separated may be prevented even when high pressure is applied therein when the ferrule 20 is inserted after expanding the synthetic resin tube 10, since an outer diameter of the synthetic resin tube 10 is great at the maximum diameter portion 15 which corresponds to a protrusion of the ferrule 20 and the end portion of the synthetic resin tube 10 is contracted to have a smaller outer diameter.

The synthetic resin tube 10 may be made of a fluoro-based resin and may be preferably made of a tetrafluoroethylene-perfluoro alkyl vinyl ether copolymer. A weight-averaged molecular weight of the polymer resin may be in the range of 500,000 to 700,000. Particularly, the polymer resin is very suitable for a resin for tubes of semiconductor facilities. The synthetic resin tube 10 may be only made of the tetrafluoroethylene-perfluoro alkyl vinyl ether copolymer, and additives, such as a pigment or the like, may be added to the polymer resin as needed. The additive content may, for example, be in the range of 0.01 to 10 parts by weight with respect to 100 parts by weight of the polymer resin.

The synthetic resin tube 10 may be generally formed in a cylindrical shape. A diameter of the synthetic resin tube 10 is not particularly limited and may be suitably modified as needed. For example, tubes with diameters that are often generally used including ¼ inch, ⅜ inch, 1 inch, 1 and ½ inch, and the like may be used as the synthetic resin tube 10. A thickness of the synthetic resin tube 10 is also not particularly limited and may be suitably modified as needed. For example, a tube thickness may be 1.2±0.102 mm when a tube diameter is ¼ inch. A tube thickness may be 1.57±0.102 mm when a tube diameter is ⅜ inch to 1 inch. A tube thickness may be 2.2±0.102 mm when a tube diameter is 1 and ½ inch.

Meanwhile, the synthetic resin tube 10 may be formed as a tube in a multilayer structure. For example, the synthetic resin tube 10 may be formed as a multilayer tube including a first tube of which a transmittance measured by JIS K 7361-1 is 73% or more based on a thickness of 1.48 mm; and a second tube of which a transmittance measured by JIS K 7361-1 is less than 73% based on a thickness of 1.47 mm.

The multilayer tube may be a double-layered tube including a first tube disposed at an inner side and a second tube disposed at an outer side; or a second tube disposed at an inner side and a first tube disposed at an outer side. In addition, the multilayer tube may be a triple-layered tube including a first tube, a second tube, and a first tube disposed from the inner side; or a second tube, a first tube, and a second tube disposed from the inner side. In addition, any one of the first tube and the second tube may have a color by including a pigment. A thickness of the first tube may be the same as or greater than a thickness of the second tube, and the thickness of the second tube may be in the range of 0.1 to 2 mm.

Each of the first tube and the second tube may independently include a tetrafluoroethylene-perfluoro alkyl vinyl ether copolymer having a weight-averaged molecular weight in the range of 500,000 to 700,000, in which the number of carbon atoms may be in the range of 105 to 300 and the number of fluorine atoms may be in the range of 210 to 500 in a perfluoro alkyl radical of the first tube, and the number of carbon atoms may be in the range of 1 to 104 and the number of fluorine atoms may be in the range of 1 to 209 in a perfluoro alkyl radical of the second tube. An image clearness of the first tube measured by JIS K 7374 may be in the range of 98 to 100% based on an optical comb width of 2 mm, in the range of 96 to 97.9% based on an optical comb width of 1 mm, in the range of 94 to 96.9% based on an optical comb width of 0.5 mm, in the range of 91 to 93.9% based on an optical comb width of 0.25 mm, and in the range of 80 to 90.9% based on an optical comb width of 0.125 mm. An image clearness of the second tube measured by JIS K 7374 may be in the range of 92 to 100% based on an optical comb width of 2 mm, in the range of 83 to 91.9% based on an optical comb width of 1 mm, in the range of 65 to 82.9% based on an optical comb width of 0.5 mm, in the range of 48 to 64.9% based on an optical comb width of 0.25 mm, and in the range of 30 to 47.9% based on an optical comb width of 0.125 mm.

For the first tube, a melting point by ASTM D3418 may be in the range of 300 to 314° C., a crystallization temperature by ASTM D3418 may be in the range of 280 to 295° C., an elongation percentage by ASTM D638 may be in the range of 370 to 384% at 23° C. and in the range of 510 to 530% at 200° C., a flexural modulus by ASTM D790 may be in the range of 350 to 515 MPa at 23° C. and in the range of 40 to 52 MPa at 200° C., a compressive modulus by ASTM D695 may be in the range of 350 to 535 MPa at 23° C. and in the range of 75 to 90 MPa at 200° C., and a linear expansion coefficient by ASTM D696 may be in the range of $10\times10^{-5}$ to $12.89\times10^{-5}$/k at 25 to 50° C. and in the range of $10\times10^{-5}$ to $17.34\times10^{-5}$/k at 25 to 200° C.

For the second tube, a melting point by ASTM D3418 may be in the range of 315 to 330° C., a crystallization temperature by ASTM D3418 may be in the range of 296 to 310° C., an elongation percentage by ASTM D638 may be in the range of 385 to 400% at 23° C. and in the range of 490 to 509% at 200° C., a flexural modulus by ASTM D790 may be in the range of 516 to 700 MPa at 23° C. and in the range of 53 to 65 MPa at 200° C., a compressive modulus by ASTM D695 may be in the range of 536 to 700 MPa at 23° C. and in the range of 60 to 74 MPa at 200° C., and a linear expansion coefficient by ASTM D696 may be in the range of $12.9\times10^{-5}$ to $16\times10^{-5}$/k at 25 to 50° C. and in the range of $17.35\times10^{-5}$ to $25\times10^{-5}$/k at 25 to 200° C.

For the first tube, a nitrogen permeability may be in the range of $7.6\times10^{-11}$ to $10.5\times10^{-11}$ cm$^3$·cm/cm$^2$·sec·cmHg, a hydrogen chloride permeability for 30 days may be in the range of 2,250 to 3,300 μg·mm/cm$^2$, a weight change after being in contact with a photoresist stripping solvent for 55 days may be in the range of 0.41 to 0.5 g, a permeability change after being in contact with a photoresist stripping solvent for 55 days may be in the range of 18.5 to 21 g/m$^2$·day, a surface roughness Ra may be in the range of 0.04 to 0.09 μm, a surface roughness Rz may be in the range of 0.3 to 0.5 μm, and a burst pressure may be in the range of 1.8 to 1.89 MPa at 30° C. and in the range of 0.95 to 1.029 MPa at 100° C.

For the second tube, a nitrogen permeability may be in the range of $4\times10^{-11}$ to $7.5\times10^{-11}$ cm$^3$·cm/cm$^2$·sec·cmHg, a hydrogen chloride permeability for 30 days may be in the range of 1,000 to 2,249 μg·mm/cm$^2$, a weight change after being in contact with a photoresist stripping solvent for 55 days may be in the range of 0.2 to 0.409 g, a permeability change after being in contact with a photoresist stripping solvent for 55 days may be in the range of 15 to 18.4 g/m$^2$·day, a surface roughness Ra may be in the range of 0.01 to 0.039 μm, a surface roughness Rz may be in the range of 0.1 to 0.29 μm, and a burst pressure may be in the range of 1.9 to 2 MPa at 30° C. and in the range of 1.03 to 1.2 MPa at 100° C.

As described above, when the synthetic resin tube 10 is formed as the multilayer tube, a transparency and other properties may be simultaneously improved, and thereby other properties including a fluid permeability, an elastic modulus, etc. are also improved while increasing distinguishability for a fluid flowing inside the tube.

The ferrule 20 is a member for enhancing sealability by being simultaneously inserted into the synthetic resin tube 10 and into the fitting 30. The ferrule 20 may be made of a plastic including a fluoro-based resin, etc. or a metal. The ferrule 20 may be formed in a cylindrical shape like the synthetic resin tube 10. An outer diameter of the ferrule 20 may be changed in a length direction, but an inner diameter thereof may be uniform over the entire length for smooth flowing of a fluid. The ferrule 20 may be formed, roughly classified, with a tube insertion portion and a fitting contact portion.

The tube insertion portion is inserted into the inside 13 of the expanded tube portion 12 of the synthetic resin tube 10, has a shape corresponding to the expanded tube portion 12, and more specifically, may sequentially include a first tapered portion 21, a boundary portion 22, a second tapered portion 23, and a uniform diameter portion 24 disposed from the innermost side which is inserted into the expanded tube portion 12. The first tapered portion 21 is a region which corresponds to the first tapered portion 14 of the synthetic resin tube 10, gradually increases in an outer diameter toward the fitting contact portion which is an end portion toward the fitting to the brink of the boundary portion 22, and may be formed as a plane and/or a curved surface. The boundary portion 22 is a region which corresponds to the maximum diameter portion 15 of the synthetic resin tube 10 and may be formed as an edge shape as illustrated in the drawings, but it also be formed as a plane and/or a curved surface. The second tapered portion 23 is a region which corresponds to the second tapered portion 16 of the synthetic resin tube 10, gradually decreases in an outer diameter toward the fitting contact portion, from the boundary portion 22 up to the uniform diameter portion 24, and may be formed as a plane and/or a curved surface. The uniform diameter portion 24 is a region which corresponds to the uniform diameter portion 17 of the synthetic resin tube 10, is uniform in an outer diameter up to a stepped portion 25, and the outer diameter thereof is smaller than the outer diameters of the boundary portion 22 and an expanded diameter portion 26. Lengths and sloped angles of the tapered portions 21 and 23, a length of the uniform diameter portion 24, and the like are designed to correspond to the expanded tube portion 12.

The fitting contact portion may sequentially include the stepped portion 25, the expanded diameter portion 26, and the rounded portion 27 disposed from the side of the synthetic resin tube 10. The stepped portion 25 is a boundary region between the uniform diameter portion 24 and the expanded diameter portion 26 and may be formed as a step structure. An end of the synthetic resin tube 10 may press against the stepped portion 25, and a height of the stepped portion 25 may be the same as the thickness of the synthetic resin tube 10. The expanded diameter portion 26 is a region in which an outer diameter thereof is enlarged by the stepped portion 25, and the outer diameter is greater than the outer diameter of the uniform diameter portion 24 by the height of the stepped portion 25 and is uniform in a length direction. The rounded portion 27 may be formed as a circular arc surface for which the portion from the expanded diameter portion 26 up to an end toward the fitting is roundly processed. The sealability may be maximized due to the rounded portion 27 even at a high pressure.

Referring to FIG. 3, the rounded portion 27 may satisfy Expression 1 below to maximize the sealability:

$$0.8 \le T1/L1 \le 1.2 \quad \text{[Expression 1]}$$

In Expression 1, T1 represents a maximum thickness in a vertical direction in a longitudinal section of the rounded portion 27, and L1 represents a maximum length in a horizontal direction in the longitudinal section of the rounded portion 27. The T1 is a thickness (height) from a boundary point between the expanded diameter portion 26 and the rounded portion 27, which is a starting point of the rounded portion 27, to an inner circumferential surface of the ferrule 20, and the T1 corresponds to the maximum thickness (height) of the rounded portion 27. The L1 is a length (width) in a horizontal direction from the boundary point to the end toward the fitting and the L1 corresponds to the maximum length (width) of the rounded portion 27. A ratio of T1/L1 is related to a curvature and a radius of curvature of the rounded portion 27 and may preferably be in the range of 0.9 to 1.1, and may most preferably be about 1. When the ratio of T1/L1 is 1, the longitudinal section of the rounded portion 27 may be a quarter-circle shape.

In addition, the ferrule 20 may satisfy Expression 2 below to maximize the sealability:

$$30 \le A1 \le 60 \quad \text{[Expression 2]}$$

In Expression 2, A1 represents an angle formed by a tangent line at the center of the circular arc surface of the rounded portion 27 and a central axis X of the ferrule 20. The A1 may preferably be in the range of 40 to 50° and most preferably be about 45°.

The fitting 30 is for connecting two synthetic resin tubes 10, and the embodiment illustrates a reducer which connects a first synthetic resin tube 10 having a larger diameter and a second synthetic resin tube (a synthetic resin tube on the right in the FIG. 2) having a smaller diameter, however the opposite case also is possible, and two of synthetic resin tubes 10 having the same diameter also may be connected. The fitting 30 may be formed to have a cylindrical and/or polyhedral shape, a step may be partially formed on an outer circumferential surface and/or an inner circumferential surface in a length direction, and thus an outer diameter and/or an inner diameter may vary depending on regions. The stepped region may be formed as a straight line and/or a curved line when viewed from the cross section. The fitting 30 may be made of a plastic including a fluoro-based resin, etc. or a metal.

The fitting 30 includes a tube accommodating portion 31 at one end portion which is an internal space accommodating the expanded tube portion 12 of the synthetic resin tube 10 and the ferrule 20. The tube accommodating portion 31 may sequentially include the rounded portion 32, a uniform diameter portion 33, and a tapered portion 34 from the inside toward the outside. The rounded portion 32 is a region which corresponds to the rounded portion 27 of the ferrule 20 and may be formed as a circular arc surface roundly processed to have the same shape as the shape of the rounded portion 27 of the ferrule 20. When the ferrule 20 and the fitting 30 are engaged, the two rounded portions 27 and 32 engage with and press against each other, and thereby the sealability may be maximized even at a high pressure. That is, a sealed region of the ferrule 20 and the fitting 30 is R region (roundly processed region) which may maximize the sealability at a high pressure. The uniform diameter portion 33 is a region which corresponds to the uniform diameter portion 17 of the synthetic resin tube 10 and has a uniform inner diameter from the rounded portion 32 up to the tapered portion 34, and the inner diameter thereof may be the same as the outer diameter of the uniform diameter portion 17 of the synthetic resin tube 10 and the outer diameter of the expanded diameter portion 26 of the ferrule 20. The tapered portion 34 is a region which corresponds to the second tapered portion 16 of the synthetic resin tube 10, gradually decreases in an inner diameter toward the inside from an entrance of the tube accommodating portion 31, and may be formed as a plane and/or a curved surface.

The synthetic resin tube 10 is inserted into the tube accommodating portion 31 of the fitting 30, but may be only inserted up to the maximum diameter portion 15 thereof, and the first tapered portion 14 of the synthetic resin tube 10 is not inserted, but may be disposed outside the fitting 30. The maximum diameter portion 15 of the synthetic resin tube 10 engages with the entrance of the tube accommodating portion 31 of the fitting 30 to form a first sealing structure, and the two rounded portions 27 and 32 of the ferrule 20 and the fitting 30 engage each other to form a second sealing structure. A screw portion 35 which engages with a nut 40 may be formed on the outer circumferential surface of the fitting 30. Although the descriptions have been made about the region at one side of the fitting 30, since the opposite region substantially has the same configuration due to a symmetrical structure, reference numerals and descriptions for the opposite region will be omitted.

The nut 40 may engage with the fitting 30 to fix the synthetic resin tube 10 in a state in which an assembly of the synthetic resin tube 10 and the ferrule 20 is inserted into the fitting 30. The nut 40 may be formed to have a polyhedral and/or cylindrical shape, a step may be partially formed on an outer circumferential surface and/or an inner circumferential surface in a length direction, and thus an outer diameter and/or an inner diameter may vary depending on regions. The stepped region may be formed as a straight line and/or a curved line when viewed from the cross section. The nut 40 may be made of a plastic including a fluoro-based resin etc. or a metal.

The nut 40 includes a fitting accommodating portion 41 which is an internal space accommodating an end portion of the fitting 30 and may be provided with a screw portion 42 on the inner circumferential surface which engages with the fitting 30. An internal side surface edge portion 43 of the fitting accommodating portion 41, when engaging with the fitting 30, strongly presses against a boundary portion of the main body portion 11 and the expanded tube portion 12, and/or the first tapered portion 14 of the synthetic resin tube 10, thereby forming a third sealing structure.

Second Embodiment

Figure 4:
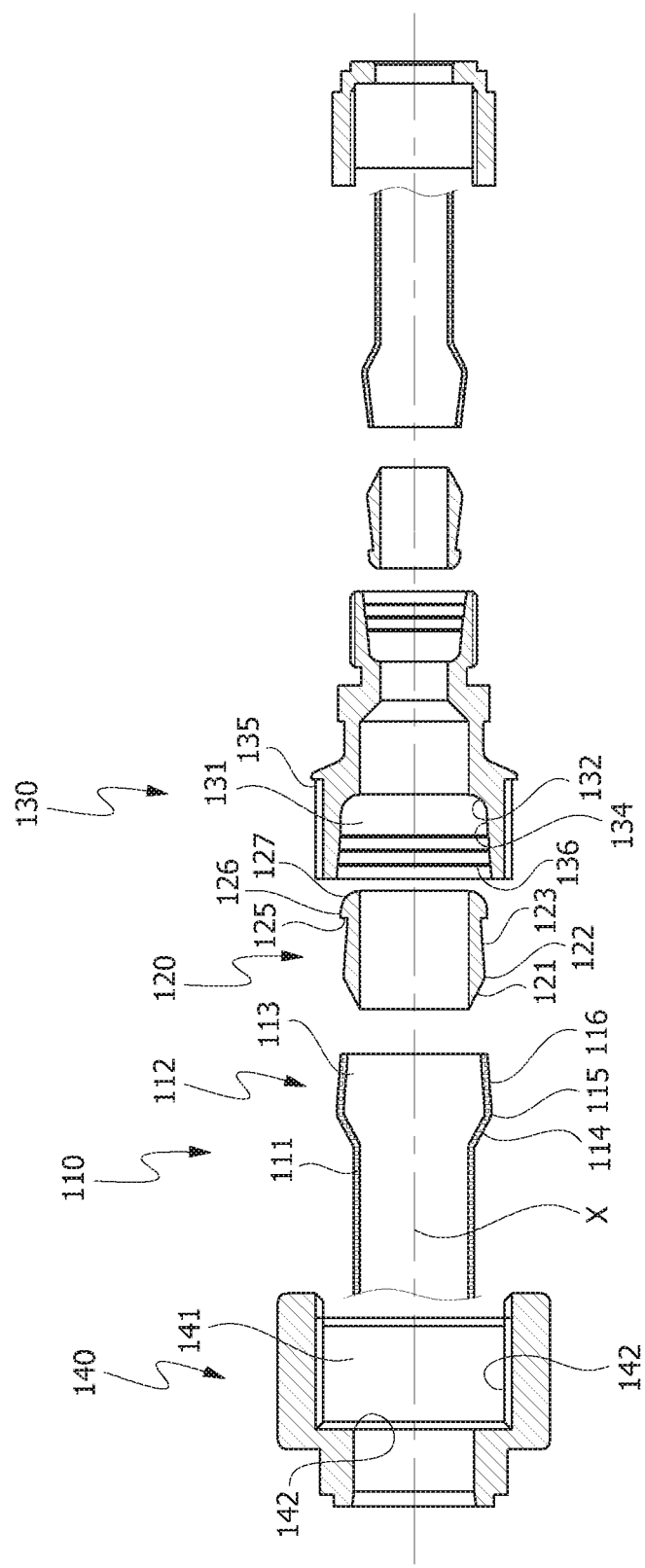
FIG. 4 is an exploded view illustrating a structure of a synthetic resin tube joint according to a second embodiment of the present invention.
Figure 5:
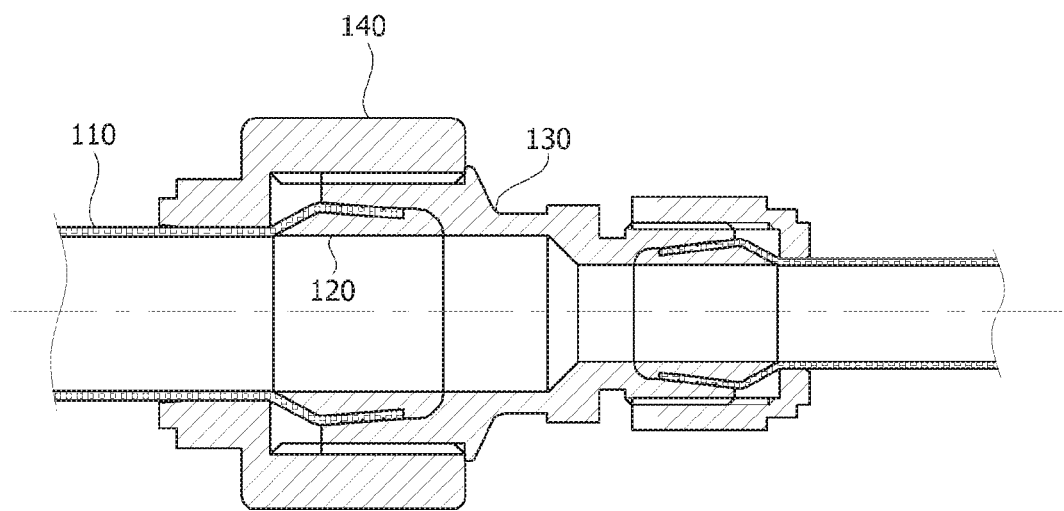
FIG. 5 is an assembly view of FIG. 4.
Figure 6:
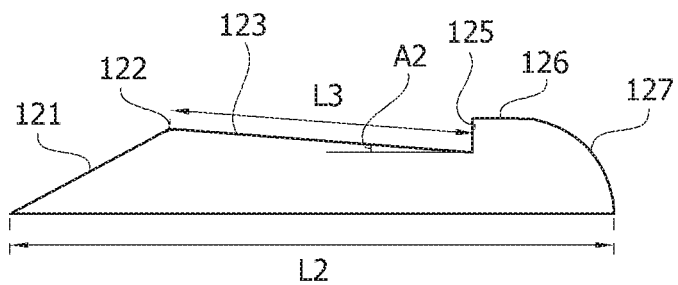
FIG. 6 is an enlarged view of a part of a ferrule illustrated in FIG. 4.
Figure 7:
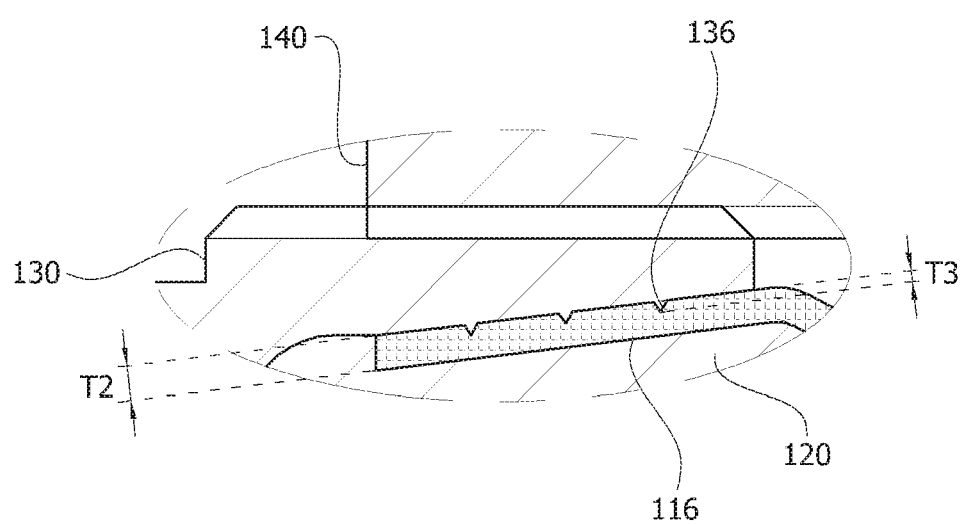
FIG. 7 is an enlarged view of a coupling region of a synthetic resin tube, a ferrule and a fitting illustrated in FIG. 5.

FIG. 4 is an exploded view illustrating a structure of a synthetic resin tube joint according to a second embodiment of the present invention, FIG. 5 is an assembly view of FIG. 4, FIG. 6 is an enlarged view of a part of a ferrule illustrated in FIG. 4, FIG. 7 is an enlarged view of a coupling region of a synthetic resin tube, a ferrule and a fitting illustrated in FIG. 5, and a joint structure of the second embodiment relates to a leak prevention structure of the synthetic resin tube joint, by a protrusion 136 of a fitting 130.

The joint structure of the second embodiment may include a synthetic resin tube 110, a ferrule 120, the fitting 130, a nut 140, etc. in the same manner as the first embodiment. Except some parts of the configuration, the second embodiment has the same configuration as the first embodiment, and therefore some of the configuration different from the first embodiment will be described in detail, but a description of the same configuration as the first embodiment will be omitted.

The synthetic resin tube 110 includes a main body portion 111 and an expanded tube portion 112, and the expanded tube portion 112 has a diameter greater than a diameter of the main body portion 111 over the entire length of the expanded tube portion 112. The ferrule 120 is inserted into an inside 113 of the expanded tube portion 112, and an inner diameter of the expanded tube portion 112 may vary corresponding to an outer diameter thereof. The expanded tube portion 112 may sequentially include a first tapered portion 114, a maximum diameter portion 115, and a second tapered portion 116 from the nearest side to the main body portion 111, when compared with the first embodiment, there is no the uniform diameter portion and the second tapered portion 116 extends long to an end of the synthetic resin tube 110. Configurations of the first tapered portion 114 and the maximum diameter portion 115 may be the same as the configurations in the first embodiment. The second tapered portion 116 is a region in which a diameter gradually decreases toward the end of the synthetic resin tube 110, from the maximum diameter portion 115 to the end of the synthetic resin tube 110, and may be formed as a plane and/or a curved surface.

The ferrule 120 includes a tube insertion portion and a fitting contact portion, and the tube insertion portion, corresponding to a shape of the expanded portion 112 of the synthetic resin tube 110, is inserted into the inside 113. The tube insertion portion may include a first tapered portion 121, a boundary portion 122, and a second tapered portion 123, when compared with the first embodiment, there is no the uniform diameter portion in the second embodiment, and the second tapered portion 123 extends long to the brink of a stepped portion 125. Configurations of the first tapered portion 121 and the boundary portion 122 may be the same as the configurations in the first embodiment. The second tapered portion 123 is a region which corresponds to the second tapered portion 116 of the synthetic resin tube 110, gradually decreases in an outer diameter toward the fitting contact portion, from the boundary portion 122 up to the stepped portion 125, and may be formed as a plane and/or a curved surface. The fitting contact portion may include the stepped portion 125, an expanded diameter portion 126, and a rounded portion 127, and their configurations may be the same as the configuration in the first embodiment. The fitting contact portion of the second embodiment, as in the first embodiment, may satisfy Expressions 1 and 2.

Referring to FIG. 6, the ferrule 120 may satisfy Expression 3 below to maximize the sealability:

$$0.3 \leq L3/L2 \leq 0.7 \qquad \text{[Expression 3]}$$

In Expression 3, L2 represents an entire length of the ferrule 120, and L3 represents a length of a sloped surface of the second tapered portion 123. The ratio of L3/L2 may preferably be in the range of 0.4 to 0.6 and may most preferably be about 0.5.

In addition, the ferrule 120 may satisfy Expression 4 below to maximize the sealability:

$$2 \leq A2 \leq 6 \qquad \text{[Expression 4]}$$

In Expression 4, A2 represents an angle formed by the sloped surface of the second tapered portion 123 and a surface parallel with a central axis X of the ferrule 120, that is, a tapered angle. The A2 may preferably be in the range of 3 to 5° and may most preferably be about 4°.

The fitting 130, as in the first embodiment, may include a tube accommodating portion 131 therein and a screw portion 135 on an outer circumferential surface. The tube accommodating portion 131 may include a rounded portion 132, a tapered portion 134 and the protrusion 136. When compared with the first embodiment, in the second embodiment, the uniform diameter portion is not present, the tapered portion 134 extends long from an entrance of the tube accommodating portion 131 up to the rounded portion 132, and the protrusion 136 which is not present in the first embodiment is formed on an inner circumferential surface of the tube accommodating portion 131. A configuration of the rounded portion 132 may be the same as the configuration in the first embodiment. The tapered portion 134 is a region which corresponds to the second tapered portion 116 of the synthetic resin tube 110, gradually decreases in an inner diameter toward the inside from the entrance of the tube accommodating portion 131 up to the rounded portion 132, and may be formed as a plane and/or a curved surface. The protrusion 136 is formed to protrude from the tapered portion 134 which is the inner circumferential surface of the tube accommodating portion 131, and the number of the protrusion 136 may be in the range of 1 to 10, and may preferably be in the range of 2 to 5. The protrusion 136 may be formed in a radial direction perpendicular to the central axis X and may also be a bit obliquely formed. The protrusion 136 may be entirely or partially formed along the inner circumferential surface of the tapered portion 134.

Referring to FIG. 7, an end of the protrusion 136 may be sharp, and a cross section of the protrusion 136 may be a triangular shape as illustrated in the drawing. Since the end of the protrusion 136 is sharp, the synthetic resin tube 110 is easily inserted into the fitting 130, and at the same time, a sealing force between the second tapered portion 116 of the synthetic resin tube 110 and the protrusion 136 is enhanced, thereby maximizing the sealability. By forming a fourth sealing structure using the protrusion 136 in addition to the above-described first to third sealing structures, the sealability may be maximized by the quadruple sealing structures. In addition, even in the case of having eccentricity in the synthetic resin tube 110, the protrusion 136 formed inside the fitting 130 presses the eccentric synthetic resin tube 110, and thereby a leak can be effectively prevented.

Referring to FIG. 7, the synthetic resin tube 110 and the fitting 130 may satisfy Expression 5 below to maximize the sealability:

$$0.1 \leq T3/T2 \leq 0.5 \qquad \text{[Expression 5]}$$

In Expression 5, T2 represents a thickness of the second tapered portion 116 of the synthetic resin tube 110, and T3 represents a thickness of the protrusion 136. The ratio of T3/T2 may preferably be in the range of 0.2 to 0.4 and may most preferably be about 0.32.

The nut 140, as in the first embodiment, may include a fitting accommodating portion 141, a screw portion 142, an internal side surface edge portion 143, etc., and their configurations may be the same as the configurations in the first embodiment.

Third Embodiment

Figure 8:
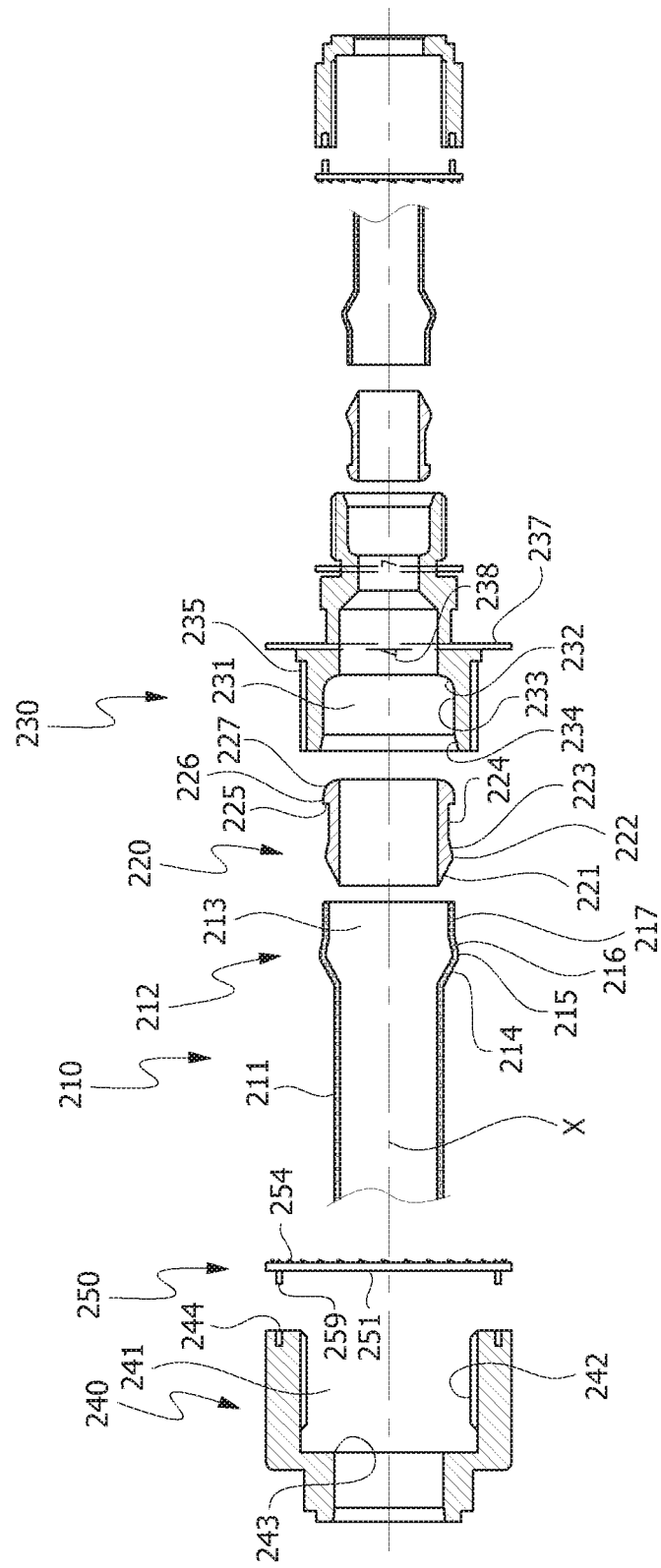
FIG. 8 is an exploded view illustrating a structure of a synthetic resin tube joint according to a third embodiment of the present invention.
Figure 9:
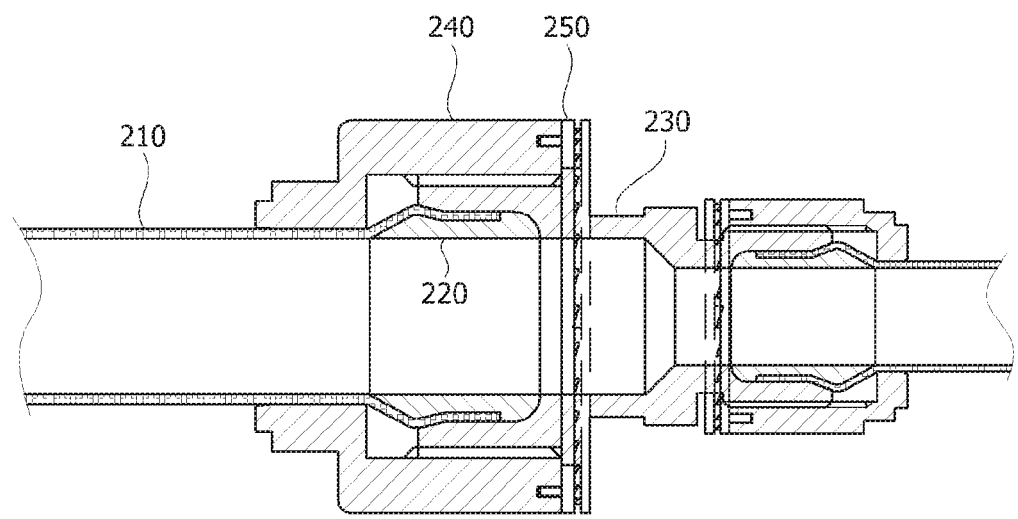
FIG. 9 is an assembly view of FIG. 8.
Figure 10:
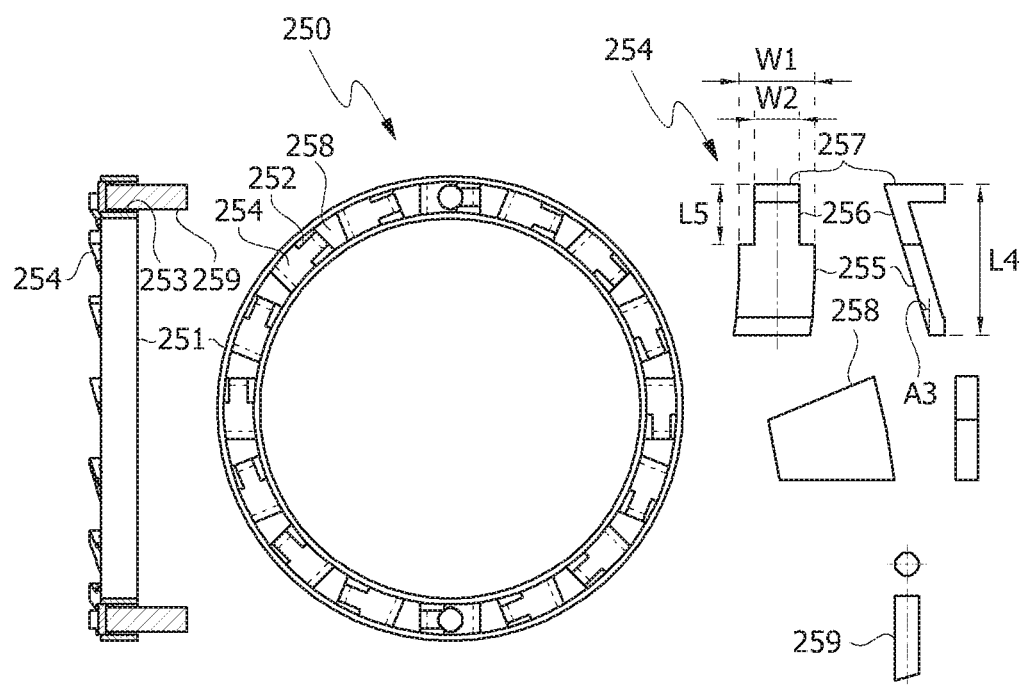
FIG. 10 is a detailed view of a ring illustrated in FIG. 8.

FIG. 8 is an exploded view illustrating a structure of a synthetic resin tube joint according to a third embodiment of the present invention, FIG. 9 is an assembly view of FIG. 8, FIG. 10 is a detailed view of a ring illustrated in FIG. 8, and a joint structure of the third embodiment relates to a structure for preventing nut loosening of the synthetic resin tube joint by sawtooth portions 238 and 254 of a fitting 230 and a ring 250, and also relates to a structure for preventing a leak at the synthetic resin tube joint by rounded portions 227 and 232 of a ferrule 220 and the fitting 230.

A joint structure of the third embodiment, as in the first embodiment, includes a synthetic resin tube 210, the ferrule 220, the fitting 230 and a nut 240, and additionally includes the ring 250. Except some parts of the configuration, the third embodiment has the same configuration as the first embodiment, and therefore some of the configuration different from the first embodiment will be described in detail, but a description of the same configuration as the first embodiment will be omitted.

The synthetic resin tube 210 may include a main body portion 211, an expanded tube portion 212, an inside 213, a first tapered portion 214, a maximum diameter portion 215, a second tapered portion 216 and a uniform diameter portion 217, and their configurations may be the same as the configurations in the first embodiment.

The ferrule 220 may include a first tapered portion 221, a boundary portion 222, a second tapered portion 223, a uniform diameter portion 224, a stepped portion 225, an expanded diameter portion 226 and a rounded portion 227, and their configurations may be the same as the configurations in the first embodiment.

The fitting 230 may include a tube accommodating portion 231, a rounded portion 232, a uniform diameter portion 233, a tapered portion 234 and a screw portion 235, and their configurations may be the same as the configurations in the first embodiment. The fitting 230 may additionally include a flange portion 237 and a sawtooth portion 238. The flange portion 237 may be formed to protrude in a ring shape from an outer circumferential surface of the fitting 230. The sawtooth portion 238 engages with the sawtooth 254 of the ring 250 to serve the role of allowing the nut 240 to rotate only in a locking direction and preventing the nut 240 from rotating in a loosening direction. The sawtooth portion 238 may be integrally formed with the flange portion 237 on a side surface of the flange portion 237 in a direction of the nut. The number of the sawtooth portions 238 may be in the range of 1 to 10 and may preferably be in the range of 2 to 5. The sawtooth 238 may include a sloped portion and a hook portion. The sloped portion may entirely be in contact with the side surface of the flange portion 237 and may partially be in contact with the side surface of the flange portion 237, and thus may be partially separated therefrom. The hook portion may be formed perpendicular to the side surface of the flange portion 237.

The nut 240 may include a fitting accommodating portion 241, a screw portion 242, an internal side surface edge portion 243, etc., and their configurations may be the same as the configurations in the first embodiment. The nut 240 may additionally include a pin accommodating portion 244. The pin accommodating portion 244 serves the role of accommodating a pin 259 of the ring 250. The pin accommodating portion 244 may be formed at an outer side surface of the nut 240 in a fitting direction. The number of the pin accommodating portions 244 may be in the range of 1 to 10 and may preferably be in the range of 2 to 5.

The ring 250 provided with the sawtooth portion 254 which engages with the sawtooth 238 formed in the fitting 230 serves the role of allowing the nut 240 to rotate only in the locking direction and preventing the nut 240 from rotating in the loosening direction. That is, due to the two sawtooth portions 238 and 254 of the fitting 230 and the ring 250, loosening of the nut 240 is prevented. The ring 250 may be made of a rubber, a plastic, a metal, or the like.

Referring to FIG. 10, the ring 250 may include a main body portion 251, the sawtooth portion 254, a sawtooth fixing portion 258 and the pin 259. The main body portion 251 is formed to have a loop shape in which the most part including the center is open, and may be provided with a groove 252 formed in a radial direction on a side surface toward the fitting and a pin accommodating portion 253 formed on the opposite surface thereof. The groove 252 may be formed in a radial direction over the entire side surface toward the fitting, and a width thereof may be in the range of 80 to 90% of an entire width of the side surface of the main body portion 251.

The sawtooth portion 254 may be inserted into the side surface groove 252 of the main body portion 251, and may be integrally formed with the main body portion 251. The number of the sawtooth portion 254 may be in the range of 2 to 30 and may preferably be in the range of 10 to 20. A maximum width of the sawtooth portion 254 may be the same as a width of the side surface groove 252. The sawtooth portion 254 may include a first sloped portion 255, a second sloped portion 256 and a hook portion 257.

The first sloped portion 255 is formed in a plate shape having a uniform thickness and to be sloped with respect to the side surface of the main body portion 251, one end of the first sloped portion 255 is in contact with the side surface of the main body portion 251 and the other part thereof is separated from the side surface of the main body portion 251, and the other end is connected to the second sloped portion 256. A slope direction of the first sloped portion 255 and a slope direction of the sloped portion of the sawtooth portion 238 of the fitting 230 may be parallel to each other and may be formed as a top and bottom symmetrical structure. Both side surfaces of the first sloped portion 255 may be formed as a circular arc surface and may each have a radius of curvature nearly corresponding to an inner diameter and an outer diameter of the ring 250.

The second sloped portion 256 is formed in a plate shape having a uniform thickness and to be sloped with respect to the side surface of the main body portion 251, the entire second sloped portion 256 is separated from the side surface of the main body portion 251, one end of the second sloped portion 256 is connected to the first sloped portion 255, and the other end thereof is connected to the hook portion 257. The second sloped portion 256 has a width smaller than a width of the first sloped portion 255, and therefore both side surfaces of the second sloped portion 256 are separated from a side wall that forms the side surface groove 252.

The hook portion 257 is formed in a plate shape having a uniform thickness, may be formed perpendicular to the side surface of the main body portion 251, one end of the hook portion 257 is connected to the second sloped portion 256, and the other end is in contact with the side surface of the main body portion 251.

Since each of the first sloped portion 255, the second sloped portion 256 and the hook portion 257 of the sawtooth portion 254 is formed in the plate shape, an appropriate elastic deformation thereof is possible when engaging with the sawtooth portion 238 of the fitting 230, thereby achieving a smooth rotation of the ring 250.

For the appropriate elastic deformation of the sawtooth portion 254 and the smooth rotation of the ring 250, the sawtooth portion 254 of the ring 250 may satisfy Expressions 6 to 8 below:

$$0.2 \geq L5/L4 \leq 0.6 \quad \text{[Expression 6]}$$

In Expression 6, L4 represents an entire length of the sawtooth portion 254, and L5 represents a length of the second sloped portion 256. The ratio of L5/L4 may preferably be in the range of 0.3 to 0.5 and may most preferably be about 0.4.

$$0.5 \leq W2/W1 \leq 0.9 \quad \text{[Expression 7]}$$

In Expression 7, W1 represents a width of the first sloped portion 255, and W2 represents a width of the second sloped portion 256. The ratio of W2/W1 may preferably be in the range of 0.6 to 0.8 and may most preferably be about 0.71.

$$10 \leq A3 \leq 25 \quad \text{[Expression 8]}$$

In Expression 8, A3 represents an angle formed by the first sloped portion 255 and the side surface of the main body portion 251. The A3 may preferably be in the range of 15 to 20° and may most preferably be about 17°.

The sawtooth fixing portion 258 is inserted between adjacent sawtooth portions 254 to serve the role of fixing the sawtooth portions 254. The sawtooth fixing portion 258 may be in a plate shape and may have a shape and a size for pressing against the sawtooth portion 254. Both side surfaces of the sawtooth fixing portion 258 may be formed as a circular arc surface and may each have a radius of curvature nearly corresponding to the inner diameter and the outer diameter of the ring 250.

The pin 259 is inserted into each of the pin accommodating portion 244 of the nut 240 and the pin accommodating portion 253 of the ring 250 and serves the role of fixing the ring 250 to the nut 240.

Fourth Embodiment

Figure 11:
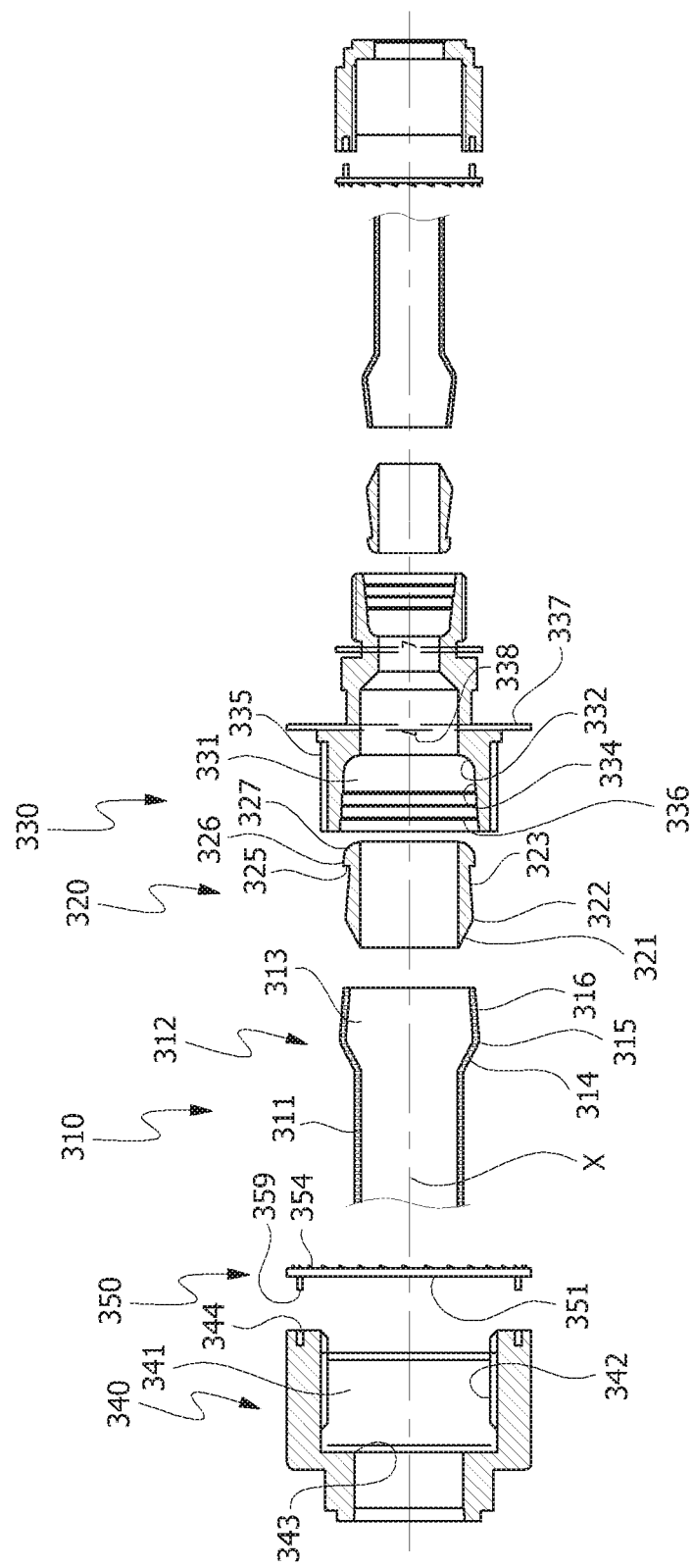
FIG. 11 is an exploded view illustrating a structure of a synthetic resin tube joint according to a fourth embodiment of the present invention.
Figure 12:
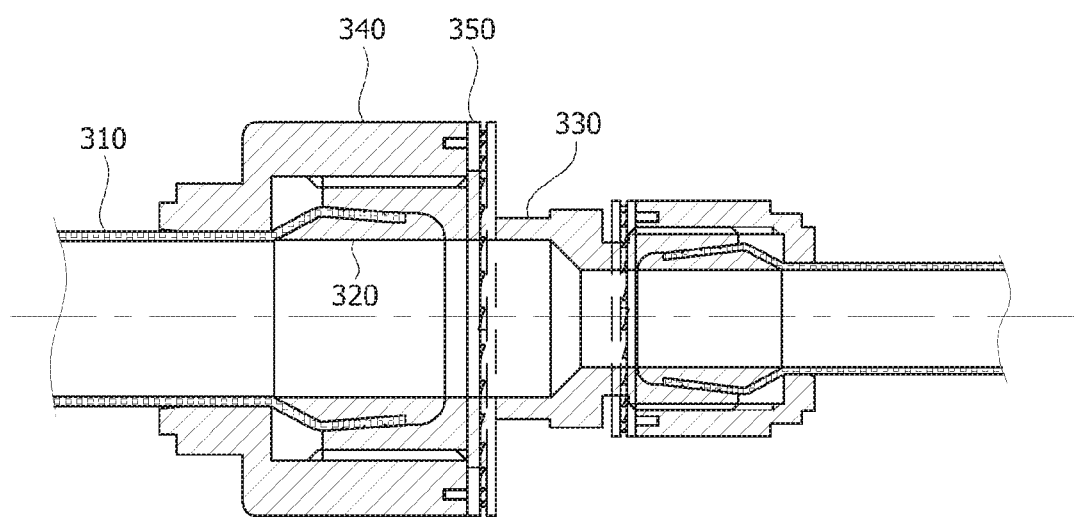
FIG. 12 is an assembly view of FIG. 11.

FIG. 11 is an exploded view illustrating a structure of a synthetic resin tube joint according to a fourth embodiment of the present invention, FIG. 12 is an assembly view of FIG. 11, and a joint structure of the fourth embodiment relates to a structure for preventing nut loosening of the synthetic resin tube joint by sawtooth portions 338 and 354 of a fitting 330 and a ring 350, and also relates to a structure for preventing a leak at the synthetic resin tube joint, by a protrusion 336 of the fitting 330.

A joint structure of the fourth embodiment, as in the third embodiment, includes a synthetic resin tube 310, a ferrule 320, the fitting 330, a nut 340 and the ring 350. Except some parts of the configuration, the third embodiment has the same configuration as the second embodiment or the third embodiment, therefore differences in the configuration from the second embodiment or the third embodiment will be described in detail, and a description of the same configuration therewith will be omitted.

The synthetic resin tube 310 may include a main body portion 311, an expanded tube portion 312, an inside 313, a first tapered portion 314, a maximum diameter portion 315 and a second tapered portion 316, and their configurations may be the same as the configurations in the second embodiment.

The ferrule 320 may include a first tapered portion 321, a boundary portion 322, a second tapered portion 323, a stepped portion 325, an expanded diameter portion 326 and a rounded portion 327, and their configurations may be the same as the configurations in the second embodiment.

The fitting 330 may include a tube accommodating portion 331, a rounded portion 332, a tapered portion 334, a screw portion 335 and the protrusion 336, and their configurations may be the same as the configurations in the second embodiment. In addition, the fitting 330 may include a flange portion 337 and a sawtooth portion 338, and their configurations may be the same as the configurations in the third embodiment.

The nut 340 may include a fitting accommodating portion 341, a screw portion 342, an internal side surface edge portion 343, a pin accommodating portion 344, and their configurations may be the same as the configurations in the third embodiment.

The ring 350 may include a main body portion 351, a side surface groove, a pin accommodating portion, a sawtooth portion 354, a first sloped portion, a second sloped portion, a hook portion, a sawtooth fixing portion, a pin 359, and their configurations may be the same as the configurations in the third embodiment.

REFERENCE NUMERALS 10, 110, 210, 310: SYNTHETIC RESIN TUBE
11, 111, 211, 311: MAIN BODY PORTION
12, 112, 212, 312: EXPANDED TUBE PORTION
13, 113, 213, 313: INSIDE
14, 114, 214, 314: FIRST TAPERED PORTION
15, 115, 215, 315: MAXIMUM DIAMETER PORTION
16, 116, 216, 316: SECOND TAPERED PORTION
17, 217: UNIFORM DIAMETER PORTION
20, 120, 220, 320: FERRULE
21, 121, 221, 321: FIRST TAPERED PORTION
22, 122, 222, 322: BOUNDARY PORTION
23, 123, 223, 323: SECOND TAPERED PORTION
24, 224: UNIFORM DIAMETER PORTION
25, 125, 225, 325: STEPPED PORTION
26, 126, 226, 326: EXPANDED DIAMETER PORTION
27, 127, 227, 327: ROUNDED PORTION
30, 130, 230, 330: FITTING
31, 131, 231, 331: TUBE ACCOMMODATING PORTION
32, 132, 232, 332: ROUNDED PORTION
33, 233: UNIFORM DIAMETER PORTION
34, 134, 234, 334: TAPERED PORTION
35, 135, 235, 335: SCREW PORTION
136, 336: PROTRUSION
237, 337: FLANGE PORTION
238, 338: SAWTOOTH PORTION
40, 140, 240, 340: NUT
41, 141, 241, 341: FITTING ACCOMMODATING PORTION
42, 142, 242, 342: SCREW PORTION
43, 143, 243, 343: INTERNAL SIDE SURFACE EDGE PORTION
244, 344: PIN ACCOMMODATING PORTION
250, 350: RING
251, 351: MAIN BODY PORTION
252: SIDE SURFACE GROOVE
253: PIN ACCOMMODATING PORTION
254, 354: SAWTOOTH PORTION
255: FIRST SLOPED PORTION
256: SECOND SLOPED PORTION
257: HOOK PORTION

258: SAWTOOTH FIXING PORTION
259, 359: PIN

What is claimed is:

1. A structure for preventing a leak at a synthetic resin tube joint, comprising:
  a synthetic resin tube including a tapered portion at an end portion;
  a ferrule inserted into the end portion of the synthetic resin tube and including a tapered portion corresponding to the tapered portion of the synthetic resin tube;
  a fitting which accommodates the synthetic resin tube and the ferrule, and includes a tapered portion corresponding to the tapered portion of the synthetic resin tube and a protrusion formed on the tapered portion of the fitting, and
  a nut which engages with the fitting;
  a rounded portion formed at an end portion of the ferrule and formed as a circular arc surface;
  a rounded portion formed inside the fitting and configured to correspond to the rounded portion of the ferrule;
  a flange portion formed to protrude from an outer circumferential surface of the fitting;
  a sawtooth portion formed on a side surface of the flange portion; and
  a ring configured to engage with a nut and including a sawtooth portion which engages with the sawtooth portion of the fitting on a side surface of the ring,
  wherein the tapered portion of the synthetic resin tube is a region in which a diameter gradually decreases toward an end of the end portion of the synthetic resin tube, from a maximum diameter portion of the synthetic resin tube to the end of the synthetic resin tube;
  wherein the tapered portion of the fitting extends from an entrance of the fitting up to the rounded portion of the fitting; and
  wherein the sawtooth portion of the ring includes a first sloped portion formed in a plate shape and configured to form a slope with respect to the side surface of the ring, a second sloped portion connected to the first sloped portion, and a hook portion which connects the second sloped portion and the side surface of the ring.

* * * * *